United States Patent
Pai et al.

(10) Patent No.: US 7,081,623 B2
(45) Date of Patent: Jul. 25, 2006

(54) WAFER-BASED ION TRAPS

(75) Inventors: Chien-Shing Pai, Bridgewater, NJ (US); Stanley Pau, Hoboken, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 301 days.

(21) Appl. No.: 10/656,432

(22) Filed: Sep. 5, 2003

(65) Prior Publication Data

US 2005/0061767 A1    Mar. 24, 2005

(51) Int. Cl.
C23F 1/00    (2006.01)
(52) U.S. Cl. .................... 250/299; 250/292; 250/282; 250/288; 216/2; 313/326
(58) Field of Classification Search .................. None
See application file for complete search history.

(56) References Cited

U.S. PATENT DOCUMENTS

| | | | |
|---|---|---|---|
| 2,939,952 A | 6/1960 | Paul et al. ................. | 250/41.9 |
| 5,166,100 A * | 11/1992 | Gossard et al. ................. | 216/2 |
| 5,248,883 A | 9/1993 | Brewer et al. ............... | 250/292 |
| 5,501,893 A | 3/1996 | Laermer et al. ............ | 428/161 |
| 5,793,091 A | 8/1998 | Devoe ........................ | 257/432 |
| 6,157,031 A * | 12/2000 | Prestage ..................... | 250/292 |
| 6,459,080 B1 | 10/2002 | Yin et al. .................... | 250/288 |
| 6,469,298 B1 | 10/2002 | Ramsey et al. ............. | 250/292 |
| 6,762,406 B1 * | 7/2004 | Cooks et al. ............... | 250/292 |

FOREIGN PATENT DOCUMENTS

| WO | WO 00/11208 | 3/2000 |
|---|---|---|
| WO | WO 01/22079 A2 | 3/2001 |

OTHER PUBLICATIONS

Cooks, et al., "*Ion trap mass spectrometers: designs and potential applications,*" Proceedings of the 49th ASMS Conference on Mass Spectrometry and Allied Topics, Chicago, Illinois, 2 pages, May 27-31, 2001.

(Continued)

*Primary Examiner*—Nikita Wells
*Assistant Examiner*—Zia R. Hashmi
(74) *Attorney, Agent, or Firm*—John F. McCabe

(57) ABSTRACT

An apparatus for an ion trap includes a semiconductor or dielectric wafer with front and back surfaces, a sequence of alternating conductive and dielectric layers formed over said front surface, and a bottom conductive layer. The sequence includes top and middle conductive layers, wherein the middle conductive layer is closer to the wafer than the top conductive layer. The middle conductive layer includes a substantially right cylindrical cavity that crosses a width of the middle conductive layer. The top and bottom conductive layers cap respective first and second ends of the cavity. The top conductive layer includes a hole that forms a first access port to the cavity. The wafer includes via through the width of the wafer. The via provides another access to the cavity via the back surface of the wafer. The wafer is substantially thicker than the sequence of layers.

20 Claims, 8 Drawing Sheets

OTHER PUBLICATIONS

Hansel, W., et al., "*Atom Chip for Transporting and Merging Magnetically Trapped Atom Clouds,*" published online at xxx.lanl.gov, Publ. No. quant-ph/0008111, 3 pages, Dec. 12, 2001.

Drndic, M., et al., "*Micro-electromagnets for atom manipulation,*" Applied Physics Letters, vol. 72, No. 22, pp. 2906-2908, Jun. 1, 1998.

Folman, R., et al., "*Controlling Cold Atoms using Nanofabricated Surfaces: Atom Chips,*" Physical Review Letters, vol. 84, No. 20, pp. 4749-4752, May 15, 2000.

Bui, H.A., et al., "*Windows Version of the Ion Trap Simulation Program ITSIM: a Powerful Heuristic and Predictive Tool in Ion Trap Mass Spectrometry,*" Journal of Mass Spectrometry, vol. 33, pp. 297-304, John Wiley & Sons, Ltd., 1998.

Badman, E.R., et al., "*Cylindrical Ion Trap Array with Mass Selection by Variation in Trap Dimensions,*" Analytical Chemistry, vol. 72, No. 20, pp. 5079-5086, Oct. 15, 2000.

Kornienko, O., et al., "*Field-Emission Cold-Cathode EI Source for a Microscale Ion Trap Mass Spectrometer,*" Anal. Chem., vol. 72, pp. 559-562, Feb. 1, 2000.

Reichel, J., et al., "*Atomic Micromanipulation with Magnetic Surface Traps,*" Physical Review Letters, vol. 83, No. 17, pp. 3398-3401, Oct. 25, 1999.

Sinha, M.P., "*Development of a Miniaturized Gas Chromatograph-Mass Spectrometer with a Microbore Capillary Column and an Array Detector,*" Anal. Chem., vol. 63, pp. 2012-2016, 1991.

Jefferts, S.R., et al., "*Coaxial-resonator-driven rf (Paul) trap for strong confinement,*" Physical Review A, vol. 51, No. 4, pp. 3112-3116, Apr. 1995.

Shivashankar, G.V., et al., "*Single DNA molecule grafting and manipulation using a combined atomic force microscope and an optical tweezer,*" Appl. Phys. Lett., vol. 71, pp. 3727-3729, 1997.

DeVoe, R.G., "*Elliptical ion traps and trap arrays for quantum computation,*" Physical Review A, vol. 58, No. 2, pp. 910-914, Aug. 1998.

Prestage, J.D. et al. "*New ion trap for frequency standard applications,*" J. Appl. Phys. vol. 66 (3), pp. 1013-1017, Aug. 1, 1989.

Jefferts, S.R., et al., "*Paul Trap for Optical Frequency Standards,*" IEEE Transactions on Instrumentation and Measurement, vol. 44, No. 2, pp. 148-150, Apr. 1995.

Folman, R., et al., "*Mastering the language of atoms,*" Nature, vol. 413, pp. 466-467, Oct. 4, 2001.

Muller, D., et al., "*Guiding Neutral Atoms Around Curves with Lithographical Patterned Current-Carrying Wires,*" Physical Review Letters, vol. 83, No. 25, pp. 5194-5197, Dec. 20, 1999.

Weinstein, J.D., et al., "*Microscopic magnetic traps for neutral atoms,*" Physical Review A, vol. 52, No. 5, pp. 4004-4009, Nov. 1995.

Denschlag, J., et al., "*Guiding Neutral Atoms with a Wire,*" Physical Review Letters, vol. 82, No. 10, pp. 2014-2017, Mar. 8, 1999.

Fortagh, J., et al., "*Miniaturized Wire Trap for Neutral Atoms,*" Physical Review Letters, vol. 81, No. 24, pp. 5310-5313, Dec. 14, 1998.

McAuley, S.A., et al., "*Silicon micromachining using a high-density plasma source,*" Journal of Physics D: Applied Physics, No. 34, pp. 2769-2774, 2001.

Brewer, R.G., et al., "*Planar ion microtraps,*" Physical Review A, vol. 46, No. 11, pp. R6781-6784, Dec. 1, 1992.

Hansel, W., et al., "*Trapped-Atom-Interferometer in a Magnetic Microtrap,*" Phys. Rev. A, vol. 64, Nov. 2001, pp. 0636027-1 to 0636027-6.

Badman, E.R., et al., "*Fourier Transform Detection in a Cylindrical Quadrupole Ion Trap,*" Analytical Chemistry, vol. 70, No. 17, pp. 3545-3547, Sep. 1, 1998.

Badman, E.R., et al., "*A miniature Cylindrical Quadrupole Ion Trap: Simulation and Experiment,*" Anal. Chem., vol. 70, No. 23, pp. 4896-4901, Dec. 1, 1998.

Ferran, R.J., et al., "High-pressure effects in miniature arrays of quadrupole analyzers for residual gas analysis from $10^{-9}$ to $10^{-2}$ Torr," J. Vac. Sci. Technol. A 14(3), pp. 1258-1265, May/Jun. 1996.

Stalder, R.E., et al., "Micromachined array of electrostatic energy analyzers for charged particles," J. Vac. Sci. Technol. A 12(4), pp. 2554-2558, Jul./Aug. 1994.

Wells, J.M., et al., "A Quadrupole Ion Trap with Cylindrical Geometry Operated in the Mass-Selective Instability Mode," Analytical Chemistry, vol. 70, No. 3, pp. 438-444 Feb. 1, 1998.

Reichel, J., et al., "Applications of Integrated Magnetic Microtraps," Appl. Phys. B 72 (2001), pp. 81-89.

Darling, R.B., et al., "Micromachined Faraday Cup Array Using Deep Reative Ion Etching," Proc. 14th Int. Conf. Micro Electro Mechanical Systems, (MEMS-2001), presented Jan. 21-25, 2001, Interlaken, Switzerland, pp. 90-94.

Lammert, et al., "Developments on the Toroid Ion Trap Analyzer," presented at the 47th ASMS Conference on Mass Spectrometry and Allied Topics, Dallas, TX, 2 pages, Jun. 13-17, 1999.

March, R.E., "Quadrupole Ion Trap Mass Spectrometer," Encyclopedia of Analytical Chemistry, pp. 11848-11872, John A. Wiley & Sons Ltd., Chichester, 2000.

Jonscher, K.R., et al., "The Whys and Wherefores of Quadrupole Ion Trap Mass Spectrometry," Ion Trap Mass Spectrometry, published online at: http://www.abrf.org/ABRFNews/1996/September1996/sep96iontrap.html, 14 pages, Mar. 11, 2003.

\* cited by examiner

← C

← O

← S

← H

WAFER-BASED ION TRAPS

BACKGROUND

1. Field of the Invention

This invention relates to ion traps and to methods for fabricating ion traps.

2. Description of the Related Art

Conventional ion traps enable both storing ionized particles and separating the stored ionized particles according to their mass (M) to charge (Q) ratios. Storing the ionized particles involves applying a time-varying voltage to the ion trap so that particles propagate along stable trajectories therein. Separating the ionized particles typically involves applying an additional time-varying voltage to the trap so that the stored particles are selectively ejected according to their M/Q ratios. The ability to eject particles according to their M/Q ratios enables the use of ion traps as mass spectrometers.

Exemplary ion traps are described, e.g., in U.S. Pat. No. 2,939,952, issued Jun. 7, 1960 to W. Paul et al, which is incorporated herein by reference in its entirety.

FIG. 1 shows one type of quadrupole ion trap 10 that has an axially symmetric cavity 18. The ion trap 10 includes metallic top and bottom end cap electrodes 12–13 and a metallic central ring-shaped electrode 14 that is located between the end cap electrodes 12–13. Points on inner surfaces 15–17 of the electrodes 12–14 have transverse radial coordinates "r" and axial coordinates "z". These coordinates satisfy hyperbolic equations, i.e., $r^2/r_0^2 - z^2/z_0^2 = +1$ for the central ring-shaped electrode 14 and $r^2/r_0^2 - z^2/z_0^2 = -1$ for the end cap electrodes 12–13. Here, $2r_0$ and $2z_0$ are the minimum transverse diameter and the minimum vertical height of the trapping cavity 18 that is formed by the inner surfaces 15–17. Typical trapping cavities 18 have a shape ratio, $r_0/z_0$, that satisfies: $(r_0/z_0)^2 \approx 2$, but the ratio may be smaller to compensate for the finite size of the electrodes 12–14. Typical cavities 18 have a size that is described by a value of $r_0$ in the approximate range of about 0.707 centimeters (cm) to about 1.0 cm.

For the above-described electrode and cavity shapes, electrodes 12–14 produce an electric field with a quadrupole distribution inside trapping cavity 18. One way to produce such an electric field involves grounding the end cap electrodes 12–13 and applying a radio frequency (RF) voltage to the central ring-shaped electrode 14. In an RF electric field having a quadrupole distribution, ionized particles with small Q/M ratios will propagate along stable trajectories. To store particles in the trapping cavity 18, the cavity 18 is voltage-biased as described above, the particles are ionized, and then, the particles are introduced into the trapping cavity 18 via an entrance port 19 in top end cap electrode 12. During the introduction of the ionized particles, the trapping cavity 18 is maintained with a low background pressure, e.g., about $10^{-3}$ Torr, of helium (He) gas. Then, collisions between the background He atoms and ionized particles lower the particles' momenta thereby enabling trapping of such particles in the central region of the trapping cavity 18. To eject the trapped particles from the cavity 18, a small RF voltage may be applied to the bottom end cap 13 while ramping the small voltage so that stored particles are ejected through exit orifice 20 selectively according to their M/Q ratio.

For quadrupole ion trap 10, machining techniques are available for fabricating hyperbolic-shaped electrodes 12–14 out of base pieces of metal. Unfortunately, such machining techniques are often complex and costly due to the need for the hyperbolic-shaped inner surfaces 15–17. For that reason, other types of ion traps are desirable.

A second type of ion trap has a trapping cavity with a right circularly cylindrical shape. This trapping cavity is also formed by inner surfaces of two end cap electrodes and a central ring-shaped electrode located between the end cap electrodes. Here, the end cap electrodes have flat disk-shaped inner surfaces, and the ring-shaped electrode has a circularly cylindrical inner surface. For such a trapping cavity, applying a voltage to the central ring-shaped electrode while grounding the two end cap electrodes will create an electric field that does not have a pure quadrupole distribution. Nevertheless, a suitable choice of the trapping cavity's height to diameter ratio will reduce the magnitude of higher multipole contributions to the created electric field distribution. In particular, if the height to diameter ratio is between about 0.83 and 1.00, the octapole contribution to the field distribution is small, e.g., this contribution vanishes if the ratio is about 0.897. For such values of this shape ratio, the effects of higher multipole distribution are often small enough so that the cavity is able to trap and store ionized particles.

For this second type of ion trap, standard machining techniques are available to fabricate the electrodes from metal base pieces, because the electrodes have simple surfaces rather than the complex hyperbolic surfaces of the electrodes 12–14 of FIG. 1. For this reason, fabrication of this second type of ion trap is usually less complex and less expensive than is fabrication of quadrupole ion traps whose electrodes have hyperbolic-shaped inner surfaces.

SUMMARY

Various embodiments provide monolithic structures for quadrupole ion traps whose trapping cavities are located in thin layer structures. Each thin layer structure is located on a front surface of a substantially thicker wafer. Thus, the ion traps have linear dimensions that are significantly smaller than the width of the wafer. The wafer is substantially thicker in order to be able to provide a sturdy support for the thin film structure in which the small ion traps are located. Methods exist for fabricating the new structures inexpensively using integrated circuit fabrication techniques.

One embodiment features an apparatus for an ion trap. The apparatus includes a semiconductor or dielectric wafer with front and back surfaces, a sequence of alternating conductive and dielectric layers formed over said front surface, and a bottom conductive layer. The sequence includes top and middle conductive layers, wherein the middle conductive layer is closer to the wafer than the top conductive layer. The middle conductive layer includes a substantially right cylindrical cavity that crosses a width of the middle conductive layer. The top and bottom conductive layers cap respective first and second ends of the cavity. The top conductive layer includes a hole that forms a first access port to the cavity. The wafer includes via through the width of the wafer. The via provides another access to the cavity via the back surface of the wafer. The wafer is substantially thicker than the sequence of layers.

Another embodiment features a method for fabricating an ion trap. The method includes forming a sequence of alternating conductive and dielectric layers on a planar front surface of a wafer and etching a right cylindrical cavity through one conductive layer of the sequence to produce a central electrode of the ion trap. The method includes forming another conductive layer over said central electrode and etching a hole through said another conductive layer to produce a first end cap electrode of the ion trap. The hole forms an access port to said cavity. The method also includes etching through a back surface of said wafer to produce a via that provides an access to a second end cap electrode of said ion trap. The second end cap electrode includes either another conductive layer of the sequence or a conductive region of the wafer.

In some Figures, dimensions of features have been increased or decreased to more clearly illustrate the features.

In the Figures and text, like reference numbers indicate features with similar functions or properties.

DETAILED DESCRIPTION OF EMBODIMENTS

Figure 1:
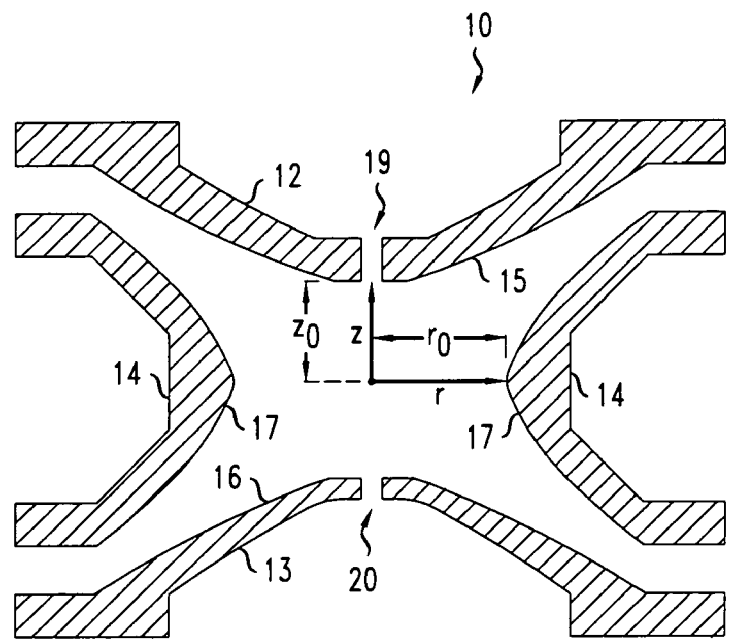
FIG. 1 is a cross-sectional view of a conventional quadrupole ion trap.
Figure 2A:
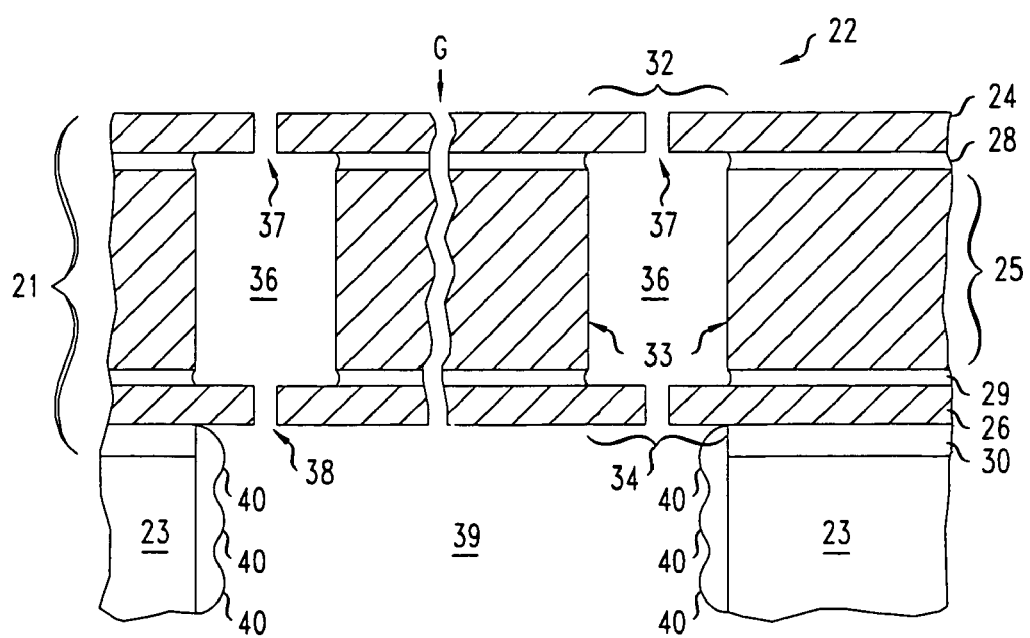
FIG. 2A is a cross-sectional view of a portion of a monolithic structure having an array of quadrupole ion traps.
Figure 2B:
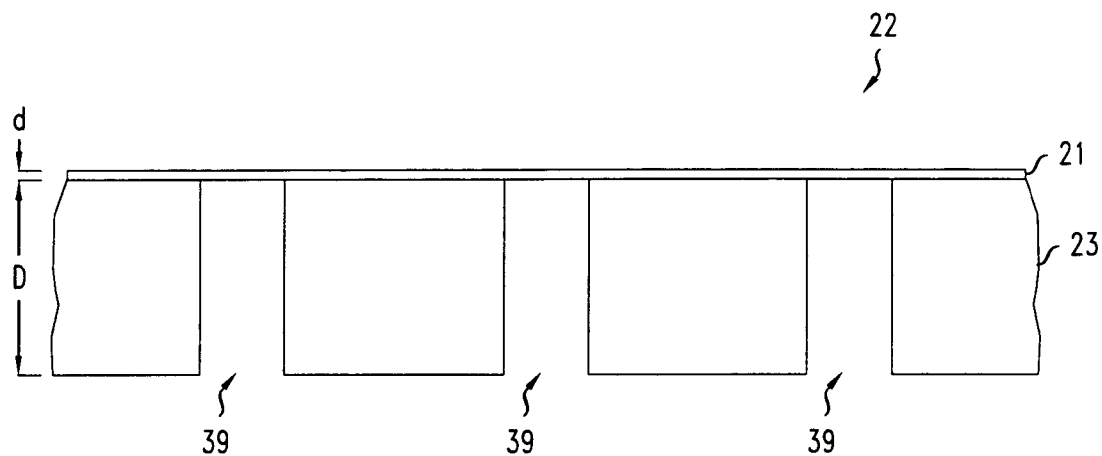
FIG. 2B is a cross-sectional view of a monolithic structure according to FIG. 2A in which relative thicknesses of the thin layer structure and the wafer are shown.

FIGS. 2A and 2B show portions of monolithic structure 22 for an array of quadrupole ion traps. The monolithic structure 22 includes a semiconductor or dielectric wafer 23, e.g., a silicon wafer or a silica-glass wafer. For clarity, mid portions of the monolithic structure 22 have been omitted in FIG. 2A as indicated by a gap G.

The monolithic structure 22 includes a thin layer structure 21 on a front surface of the wafer 23. The thin layer structure 21 includes a sequence of alternating conductive layers 24–26 and relatively thinner dielectric layers 28–30. Exemplary materials for the conductive layers 24–26 are metals, heavily doped semiconductors, conductive suicides, and combinations of these materials. Exemplary conductive layers 24–26 have thicknesses between about 0.2 µm and several micrometers. Often, the middle conductive layer 25, which determines the height of the ion trap, is thick, and the top and bottom conductive layers 24, 26 are relatively much thinner. The dielectric layers 28–30 electrically isolate the conductive layers 24–26 from each other and from the wafer 23. Exemplary materials for the dielectric layers 28–30 are inorganic nitrides or oxides and polymer dielectrics. Exemplary dielectric layers 28–30 have thicknesses of less than 0.1 µm. Exemplary thin layer structures 21 have a thickness, d, that is about ten or more times smaller than the thickness, D, of the wafer substrate 23. The wafer 23 is substantially thicker than the thin layer structure 21, i.e., has a thickness that is, at least, a few times the thickness of the thin layer structure 21. Its substantially thicker form enables the wafer 23 to provide physical handling support for the whole monolithic structure 22. Exemplary thin layer structures 21 on a silicon (Si) wafer have a thickness of 20 micrometers (µm) or less and preferably of 5 µm or less whereas an exemplary Si wafer 23 typically has a thickness of more than 250 µm.

In monolithic structure 22, thin layer structure 21 includes the array of quadrupole ion traps. The ion traps have top end cap, central, and bottom end cap electrodes 32–34, which are formed by portions of the top, middle, and bottom conductive layers 24–26, respectively. The central electrodes 33 include right cylindrical holes that are cavities 36 of the ion traps. The top and bottom electrodes 32, 33 include cylindrical ports 37, 38 for introducing ions into the right cylindrical trapping cavities 36 and ejecting ions from the right cylindrical trapping cavities 36, respectively, or vice-versa. The trapping cavities 36 have central axes that are oriented transverse to conductive layer 25.

Figure 2C:
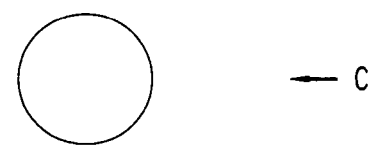
FIG. 2C shows exemplary cross-sectional shapes for trapping cavities of the monolithic structure of FIG. 2A.
Figure 2C:
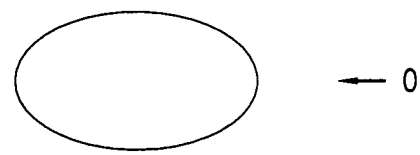
Figure 2C:
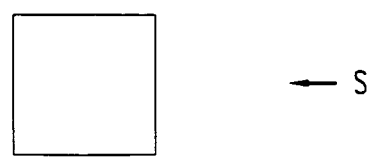
Figure 2C:

Herein, a right cylindrical cavity has a surface that is swept out by a straight-line segment as a point on the segment traces out a plane closed curve while keeping the segment normal to the surface of the curve. FIG. 2C shows cross sectional shapes of exemplary right cylindrical cavities, i.e., shapes associated with a circle, C; an oval, O; a square, S; and a truncated hyperbola, H. In various embodiments, trapping cavities 36 may have one of these cross sectional shapes or other shapes. Cavities having substantially right cylindrical shapes can be produced by standard mask-controlled anisotropic dry etching techniques.

The conductive layers 24–26 include electrical contacts (not shown) for applying separate biasing voltages to each of electrodes 32–34. The electrical contacts may connect to the electrodes 24–26 of separate ion traps individually or connect to equivalent electrodes 24–26 of separate ion traps in parallel.

For each trapping cavity 36, one or more entrance ports 37 opens out to the front side of the monolithic structure 22, and one or more exit ports 38 opens out to the backside of the monolithic structure 22. In embodiments with one entrance port 37 and one exit port 38 per trapping cavity 36, the port diameters are less than ½ of the diameters of the associated trapping cavities 36 so that the ports 37, 38 do not substantially deform the approximate quadrupole electric field distributions in the trapping cavities 36.

In monolithic structure 22, the heights of trapping cavities 36 are less than the width of the thin layer structure 21. Since this width is typically 10 or more times smaller than that of the supporting wafer 23, the heights of the cavities 36 are ten or more times smaller than the width of the wafer 23, i.e., the trapping cavities 36 are very small. The wafer 23 must be substantially thicker than the thin layer structure 21, e.g., 10 times thicker, so that the wafer 23 provides a robust physical support for the array of tiny ion traps. Nevertheless, exit ports 38 must be accessible through the backside of such a thick wafer 23. To accommodate these two needs, the monolithic structure 22 includes deep vias 39 that cross the entire width of thick wafer 23 and provide physical access to the exit ports 38 through the back surface of the wafer 23. The sidewalls of the deep vias 39 typically have regular series of ridge-like bumps 40 indicative of the repeated steps of a deep etch process used to produced such deep vias 39.

The operation of quadrupole ion traps of monolithic structure 22 is similar to the operation of conventional quadrupole ion traps. Storing molecules in the ion traps includes introducing ionized molecules into the trapping cavities 36 by projecting a stream of the molecules towards entrance ports 37 while bombarding the molecules with electrons that cause ionization. The ionized molecules then, enter the trapping cavities 36 via the ports 37. Storing molecules also includes grounding end cap electrodes 32 and 34 while applying an RF voltage to central electrodes 33 so that a trapping RF electric field is present in each trapping cavity 36 when the ionized particles are introduced therein. Each trapping cavity 36 has a shape that ensures that the trapping electric field therein will be a good approximation to a quadrupole field distribution. For a right circularly cylindrical trapping cavity 36 whose height over diameter ratio is in the range of about 0.83 to about 1.0 and preferably is about equal to 0.897, the above voltage biasing scheme typically produces an electric field whose distribution well approximates that of a quadrupole distribution in the trapping cavity 36. Storing molecules also includes maintaining a low pressure of helium (He) in the trapping cavities 36, e.g., a $10^{-3}$ Torr pressure while the ionized particles are introduced therein. He atoms of the gas collide with the introduced ionized molecules thereby lowering the molecules' momenta so that the molecules can be trapped in the central region of the trapping cavities 36. Ejecting the ionized molecules from the trapping cavities 36 involves increasing the amplitude of the RF voltage that biases the central electrodes and/or applying a smaller RF voltage to the bottom end cap electrodes 34 to resonantly eject trapped ions via exit ports 38.

Various embodiments of monolithic structure 22 provide several advantages over conventional ion traps. First, trapping cavities 36 are typically small, which implies that biasing voltages during operation are typically low. For this reason, the ion traps of the monolithic structure 22 typically consume electrical energy at lower rates during operation. Second, the small size of the ion traps could potentially aid in incorporating the monolithic structure 22 in new types of devices, e.g., handheld mass spectrometers. Third, some embodiments of the monolithic structure 22 incorporate large numbers of ion traps. Since ion traps typically only store ions in central portions of trapping cavities, some such large arrays should store ions at higher surface-densities than conventional single ion traps. The higher surface-density storage should enable production of mass spectrometers with higher sensitivities and/or mass sweep rates.

Figure 3:
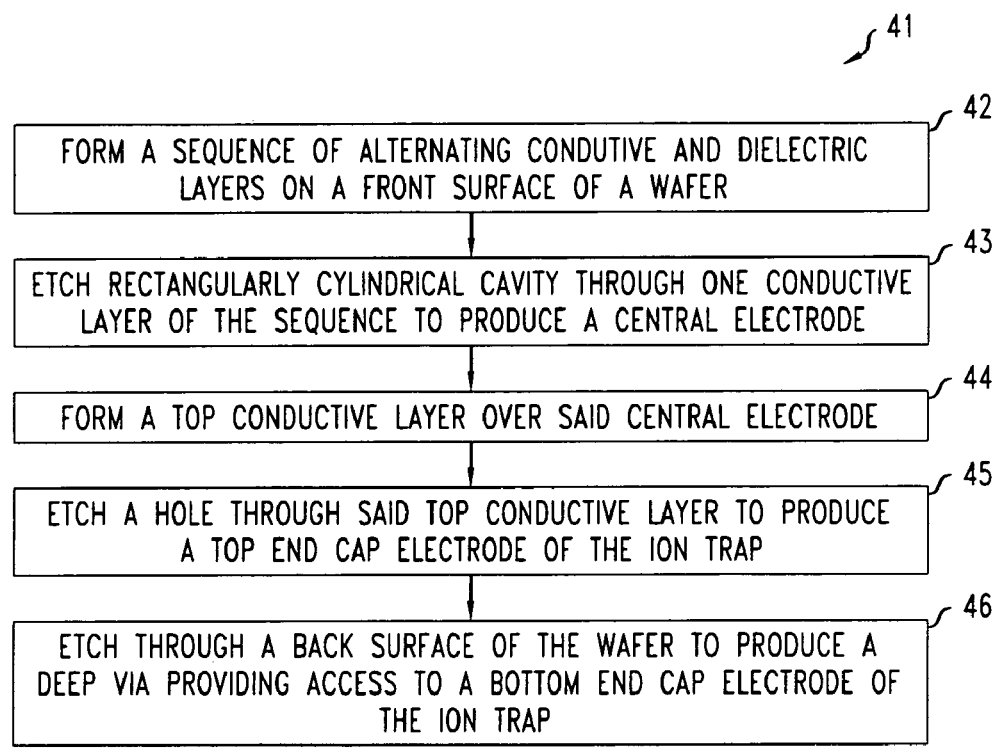
FIG. 3 is a flow chart illustrating a method for fabricating arrays of quadrupole ion traps on a wafer.

FIG. 3 illustrates a method 41 for fabricating a monolithic structure including a thin layer structure for one or more ion traps and a supporting relatively thicker wafer, e.g., structure 22 of FIGS. 2a and 2B. In the final fabricated structure, each ion trap has a trapping cavity that is formed by two end cap electrodes and one central electrode, wherein the central electrode is located between the end cap electrodes.

The method 41 includes forming a sequence of alternating conductive layers and dielectric layers on a planar front surface of a dielectric or semiconductor wafer (step 42). In the sequence, the one or more dielectric layers are significantly thinner than the one or more conductive layers. The dielectric layers provide electrical insulation of the one or more conductive layers from each other and may also insulate the one or more conductive layers from an underlying conductive surface region of the wafer. Forming the one or more conductive layers includes evaporation-depositing metal, chemical vapor depositing (CVD) doped semiconductor, and/or depositing conductive silicide. If the sequence includes a single conductive layer, forming the sequence also includes first forming a conductive surface region on the wafer, e.g., via implant doping a surface portion of a silicon wafer and then annealing the wafer to activate implanted dopant atoms. Forming the one or more dielectric layers includes chemical vapor depositing oxide or nitride or spin coating and curing a layer of polymer precursor.

The method 41 includes dry etching a right cylindrical cavity through, at least, one conductive layer of the sequence to produce the central electrode of the ion trap (step 43). The central electrode may include a single conductive layer or more than one adjacent conductive layers. Either an underlying conductive layer of the sequence or a conductive surface region of the wafer forms the bottom end cap electrode of the cavity.

The method 41 includes forming a top conductive layer over the central electrode (step 44). Forming the top conductive layer involves performing one of the processes for forming a conductive layer as described in above step 42. If the sequence of underlying layers does not include a top dielectric layer, another deposition produces such a layer to provide electrical insulate the subsequently formed top conductive layer from the underlying central electrode of the ion trap. Together the top conductive layer and the underlying sequence of conductive and dielectric layers forms the thin layer structure that will include the trapping cavity of the final ion trap.

Prior to forming the top conductive layer, method 41 may include forming a layer of sacrificial material that fills the cavity in the central electrode and produces a flat top surface over a top end of said cavity. Exemplary steps for forming the layer of sacrificial material include depositing the sacrificial material and then, performing a chemical mechanical polishing (CMP) step to produce a flat top surface thereon. The flat top surface enables the subsequent deposition step to produce a flat bottom surface for the top conductive layer, i.e., a surface appropriate for the end cap electrode of a right cylindrical trapping cavity. After forming the top conductive electrode, another etch will remove the sacrificial material from the trapping cavity.

Herein, a sacrificial material refers to a material that is added to an intermediate structure to provide structural support in subsequent fabrication steps and then, is substantially removed prior to completion of the final structure.

The method 41 includes dry etching a hole through the top conductive layer to complete fabrication of a top end cap electrode for the ion trap (step 45). The etched hole forms one access port to the right cylindrical cavity, i.e., the trapping cavity.

The method 41 also includes performing a deep etch through a back surface of the wafer to make a deep via that provides physical access to the trap's bottom end cap electrode (step 46). The deep via is aligned to expose a second port to the trapping cavity, i.e., a port located in the bottom end cap electrode. The lateral extend of the deep via is limited so as to not compromise the structural handling support that is provided by the thick wafer. Performing the deep etch involves doing a mask-controlled series of alternating shallow plasma etches, e.g., with depths of 2–3 μm, and polymer depositions until the resulting via traverses the entire thickness or almost the entire thickness of the wafer. The deep etch forms the backside via with substantially vertical walls and typically exposes a portion of the bottom electrode of the ion trap. The sidewalls of the deep via will have a regular series of ridge-like bumps that are indicative of the series of repeated etch and polymer deposition steps used to produce the deep via. Exemplary methods for performing deep etches of wafers are described in U.S. Pat. No. 5,501,893, issued Mar. 26, 1996 to F. Laermer et al ('893 patent), which is incorporated by reference herein in its entirety.

Figure 4:
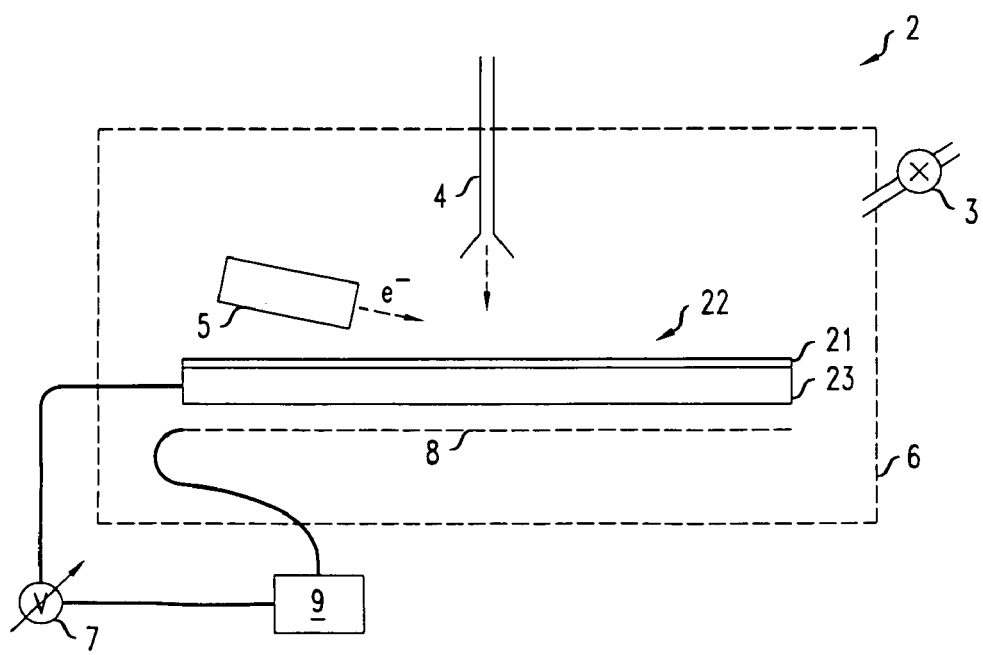
FIG. 4 shows one embodiment of a mass spectrometer that incorporates an array of quadrupole ion traps.

FIG. 4 shows an embodiment of a mass spectrometer 2 that incorporates an array of quadrupole ion traps. The mass spectrometer 2 includes a vacuum pump 3, a sprayer 4, monolithic structure 22 of FIGS. 2A and 2B, an electron gun 5, a vacuum container 6, a variable voltage source 7, an ion detector 8, and a computer 9. The sprayer 4 injects molecules over the top surface of the monolithic structure 22 for storage in the ion traps therein. The electron gun 5 bombards the sprayed molecules with electrons to cause ionization. The sprayer 4 and electron gun 5 are configured so that a portion of the ionized molecules will enter entrance ports 37 to trapping cavities 36 of the monolithic structure 22. The vacuum pump 3 and container 6 maintain the pressure in the ion traps and near the associated entrance and exit ports 37, 38 at a low value, e.g., $10^{-3}$ Torr or lower. The variable voltage source 7 biases trap electrodes of the monolithic structure 22 appropriately for storing the ionized molecules and/or ejecting stored ionized molecules with selected Q/M ratios. The ion detector 8 is located adjacent the backside of the monolithic structure 22 and is spatially segmented so that ions from different exit ports 38 of the monolithic structure 22 are detected in separate segments of the ion detector 8. The computer 9 operates the pump 3, the sprayer 4, the electron gun 5, and the variable voltage source 6, receives ion-count data from the ion detector 7, and uses the data to determine the Q/M ratios and fluxes for the detected ionized particles.

Various embodiments of the mass spectrometer 2 provide advantageous methods for analyzing mass spectra. Some embodiments perform mass analyses via a bulk mode in which multiple ion traps of the monolithic structure 22 have equivalent voltage biases. In the bulk mode, the multiple ion traps store and/or eject ions with the same Q/M ratios simultaneously. The presence of such equivalently operated ion traps increases overall sensitivity of the mass spectrometer 2, e.g., and enabling more rapid spectral analysis than an equivalent mass spectrometer with only a single ion trap. Some embodiments perform said mass analyses via a parallel mode in which inequivalent voltage biases are applied to different ion traps of the monolithic structure 22. In the parallel mode, the different ion traps store and/or eject ions with different Q/M ratios. This enables different ion traps of the monolithic structure 22 to analyze separate portions of the Q/M spectrum, i.e., a parallel spectral analysis. The parallel mode enables more rapid sweeps of the mass spectrum of a sample gas that is being analyzed.

EXAMPLE 1

Figure 5:
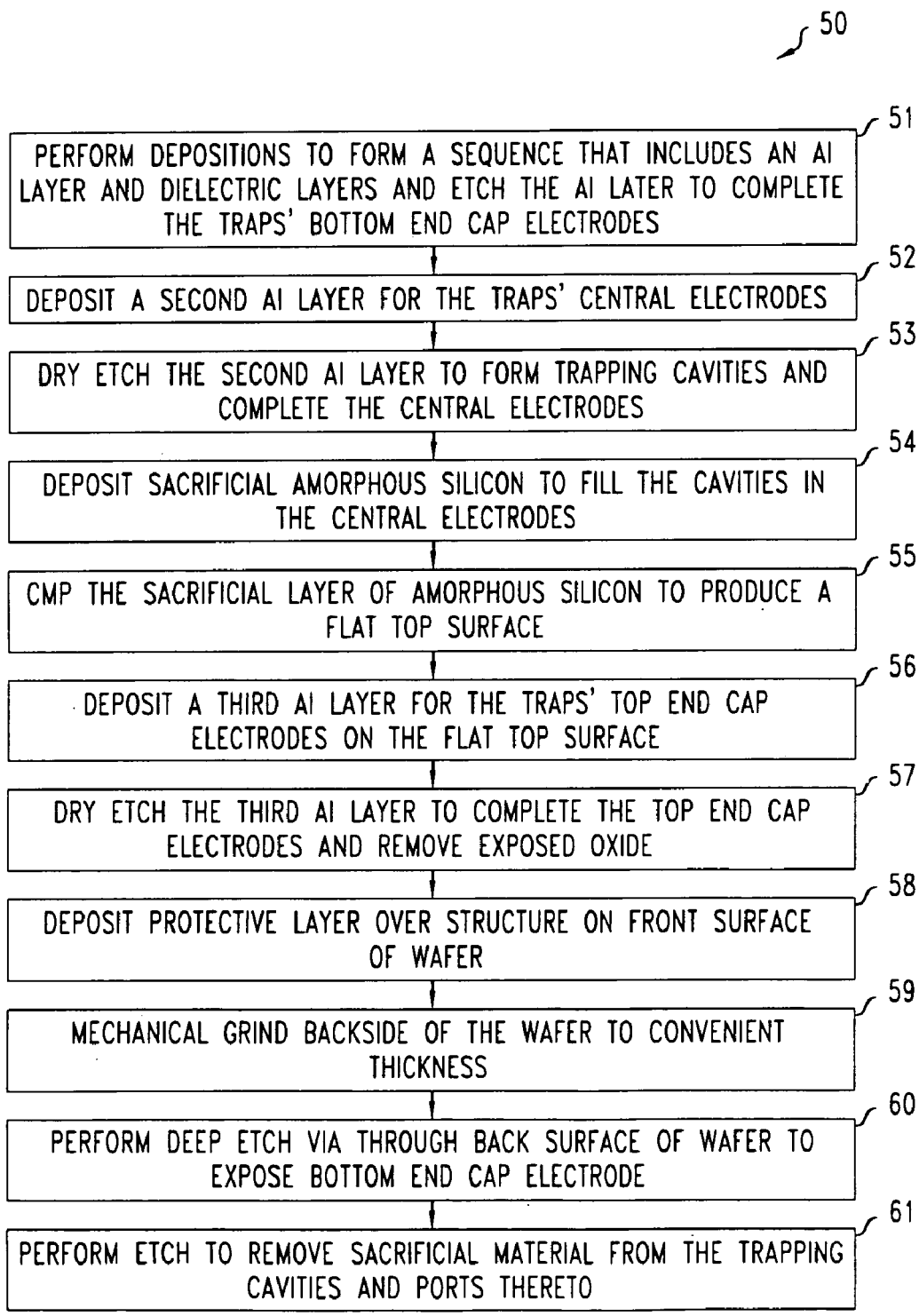
FIG. 5 is a flow chart showing a specific method for fabricating a monolithic structure for an array of quadrupole ion traps according to the method of FIG. 3.

FIG. 5 illustrates an exemplary method 50 for fabricating a monolithic structure 22' with an array of micro-ion traps in accordance with method 41 of FIG. 3. The method 50 includes performing first and second sequences of steps I, II from respective front and back surfaces of a silicon (Si) support wafer 23. The steps produce structures 71–77, 22' of FIGS. 6–13. In FIGS. 6–13, gap "G" indicates portions of the structures 71–77, 22' that have been omitted for clarity.

From the front surface of the Si wafer 23, the method 50 includes performing the following sequence of fabrication steps.

Figure 6:
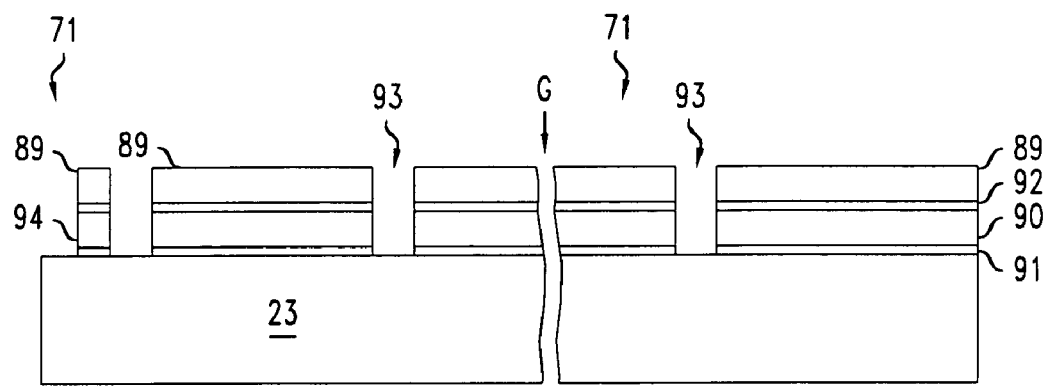
FIGS. 6–12 are cross-sectional views of intermediate structures produced during the fabrication method of FIG. 5 and related fabrication methods.

First, a series of layer depositions on wafer 23 and a series of dry etches produces structure 71 of FIG. 6, which includes a sequence of layers (step 51). The sequence includes a conductive Al layer 90 and relatively thinner dielectric layers 91–92 that surround the Al layer 90. Lateral portions of the Al layer 90 will form bottom end cap electrodes of the final ion traps. The Al layer 90 includes circular holes 93 that will be the exit ports of the ion traps and electrical contacts 94 for the bottom end cap electrodes. The wafer 23 is a standard Si wafer with an initial thickness of about 750 µm.

For making structure 71, the series of layer depositions includes a deposition of $SiO_2$ layer 91 to a thickness of about 0.2 µm, a deposition of aluminum (Al) layer 90 to a thickness of about 0.3 µm, and a deposition of $SiO_2$ layer 92 to a thickness of about 0.1 µm. The depositions for the $SiO_2$ layers 91, 92 are plasma enhanced chemical vapor depositions (PECVD) that are performed at about 250° C.–400° C. The deposition for the Al layer 90 is a physical vapor deposition (PVD), a sputtering deposition at 20° C.–250° C., or an evaporation-deposition.

For making structure 71, the series of dry etches includes a reactive ion (RIE) plasma etch that is controlled by a photoresist mask 89 and stops on oxide and a second RIE plasma etch that removes remaining exposed portions of $SiO_2$ layer 91. The features of the mask 89 define exit ports 93 and electrode contacts 94. Typical exit ports 93 have a diameter of about 0.33 µm. After the dry etch, a conventional plasma or wet strip removes the photoresist mask 89.

Figure 7:
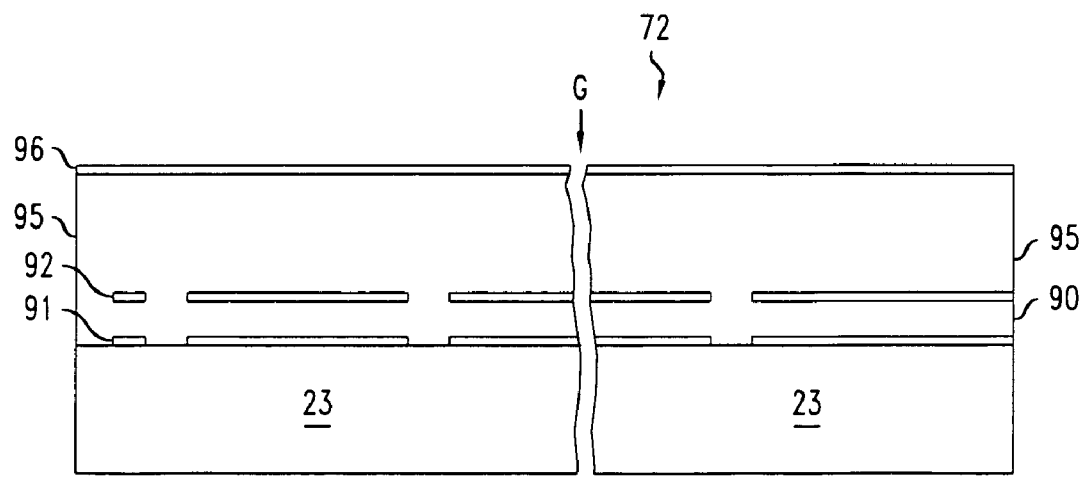

Next, a series of depositions on structure 71 forms a second conductive Al layer 95 for the central electrodes of the ion traps and a top dielectric layer 96 as shown in structure 72 of FIG. 7 (step 52). To form layers 95 and 96, first a deposition forms the Al layer 95 with a thickness of about 1.0 µm on the structure 71. Then, a second deposition forms the dielectric layer 96 by depositing about 0.1 µm of $SiO_2$ or silicon nitride on the Al layer 95. The Al and dielectric depositions involve processes of types already discussed with respect to above step 51.

Figure 8:
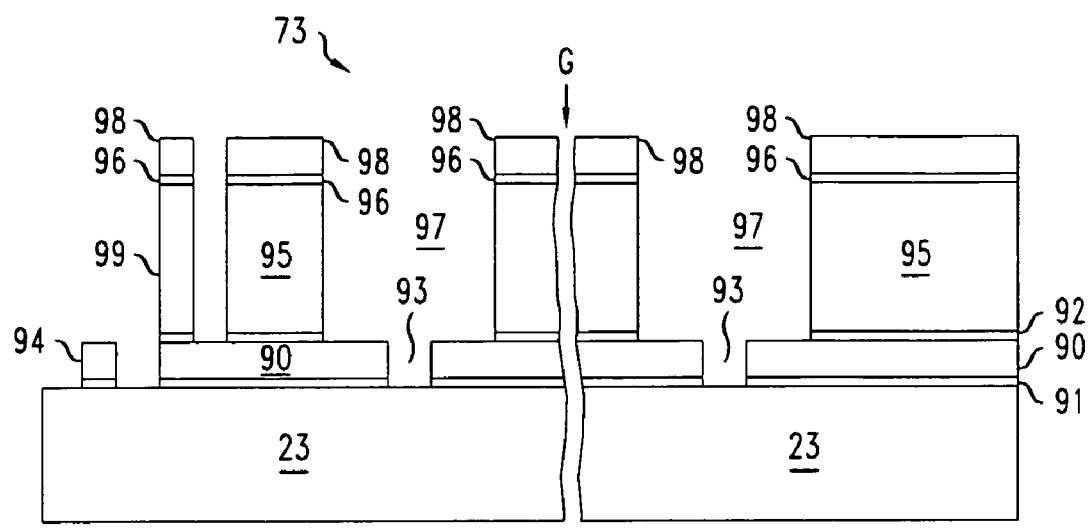

Next, a sequence of etches on structure 72 completes central electrodes of the ion traps and re-forms the exit ports 93 and electrical contacts 94 of the bottom electrodes as shown in structure 73 of FIG. 8 (step 53). The central electrodes have circularly cylindrical cavities with that are aligned over associated ones of the exit ports 93. The cavities 97 have diameters of about 1 µm. The sequence of etches includes lithographically forming a photoresist mask 98 on the structure 72, RIE plasma etching away the exposed portions of top dielectric layer 96, RIE plasma etching away portions of Al layers 95 and 90 that are not protected by either the mask 98 or $SiO_2$ layer 92, and then, RIE etching away the remaining exposed portions of the $SiO_2$ layer 92. The RIE plasma etch forms trapping cavities 97 and electrical contacts 99 of the central electrodes and re-forms the exit ports 93 and electrical contacts 94 of the associated bottom end cap electrodes. The sequence of etches also includes plasma stripping the photoresist mask 98.

Figure 9:
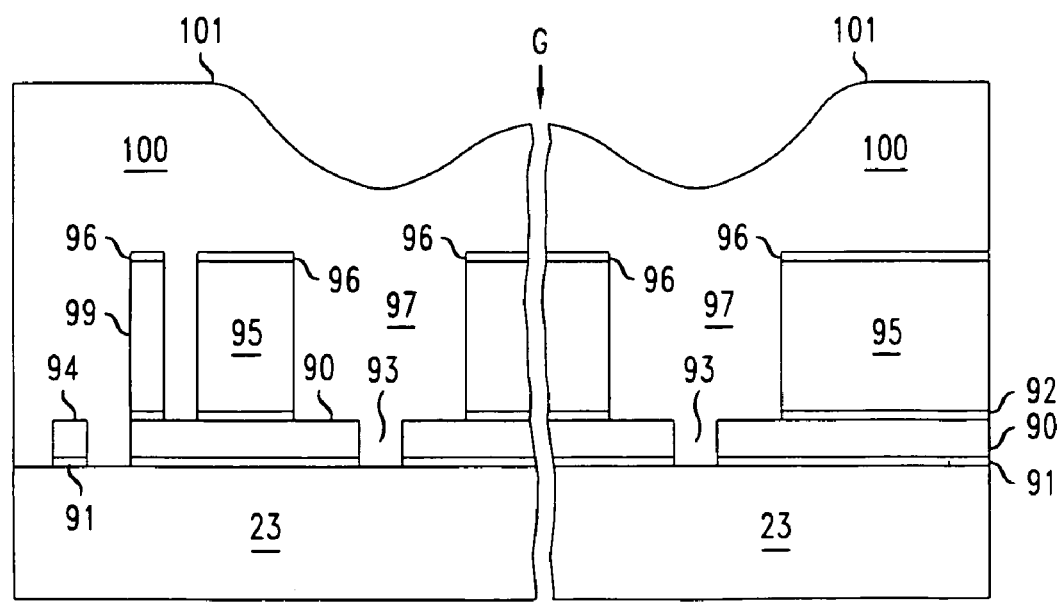

Next, a deposition produces a layer 100 of sacrificial amorphous silicon on structure 73 as shown in structure 74 of FIG. 9 (step 54). The sacrificial amorphous silicon fills trapping cavities 97 of central electrodes. The deposition involves performing a PECVD of Si at 250° C.–400° C., a sputtering deposition of Si at 20° C.–250° C., or an evaporation-deposition of Si. After the deposition, the top surface 101 of the structure 74 is not flat due to the nontrivial topography of the structure 73 on which the amorphous silicon was deposited.

Next, a CMP of the sacrificial material's top surface 101 produces a structure with a smooth and flat top surface, i.e., a surface suitable as a base for fabrication of top end cap electrodes (step 55). The CMP uses a chemical agent that selectively removes the sacrificial amorphous silicon. For that reason, the CMP stops on the planar surface of dielectric layer 96 thereby producing a flat top surface in the final structure.

Figure 10:
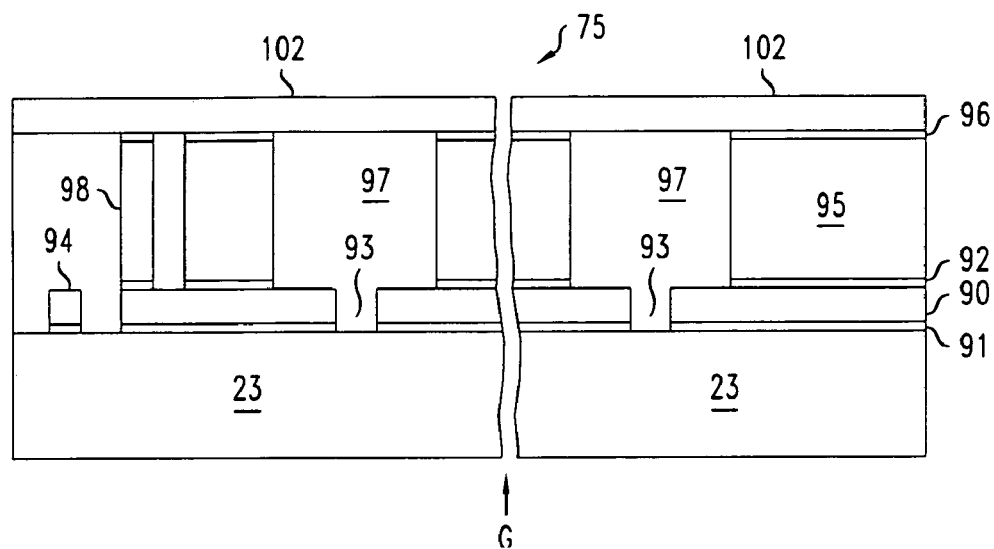

Next, a deposition on the last-described structure forms a third conductive Al layer 102 for the top end cap electrodes as shown in structure 75 of FIG. 10 (step 56). The deposition uses one of the Al deposition techniques of step 51 to produce Al layer 102 to a thickness of about 0.3 μm. The deposited Al layer 102 has a flat lower surface due to the flat base surface that was produced by the depositing sacrificial material and performing a CMP.

At this point, Al layer 102 is typically highly reflective and thus, obscures any underlying optical alignment marks. Typically, one or more sets of such optical alignment marks have been formed on an unused portion of layers 90–92, 95–96, and/or in substrate 23, i.e., via etch and/or deposition processes. The alignment marks aid in optically aligning masks used to fabricate structure 75. To re-expose said alignment marks a dry etch is performed on the deposited Al layer 102 over the general area where the alignment marks were previously formed. The re-exposed alignment marks will provide optical reference points for aligning the masks of subsequent front side and backside dry etches.

Figure 11:
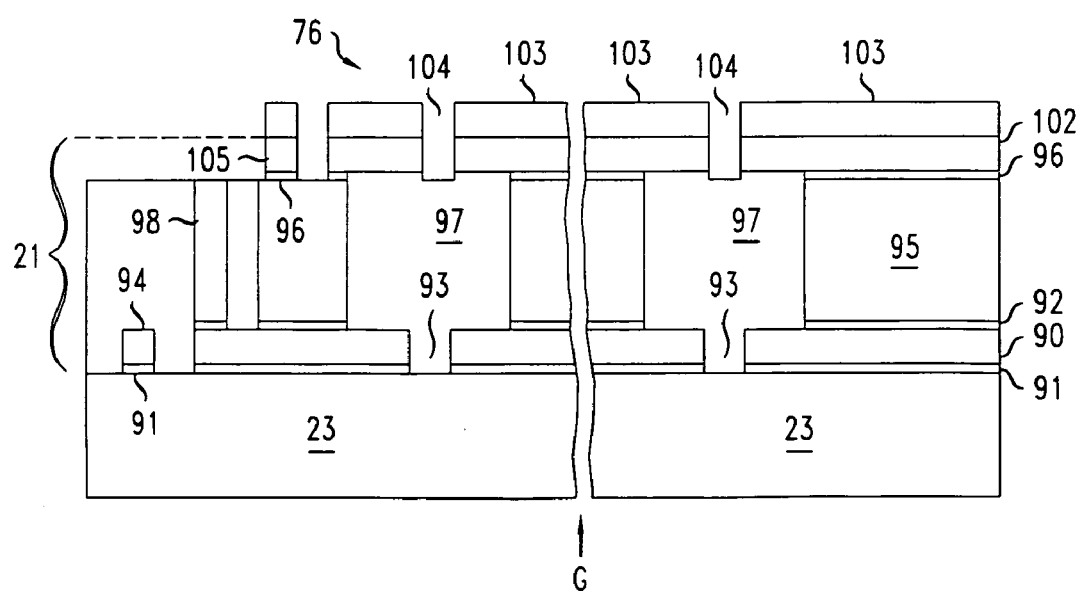

Next, a two-step series of etches on structure 75 completes top end cap electrodes as shown in structure 76 of FIG. 11 (step 57). The first step of the series involves performing a mask-controlled dry etch of Al layer 102 to produce entrance ports 104 for trapping cavities 97 and contact electrodes 105 for the top end cap electrodes. The entrance ports 104 are cylindrical holes whose diameters are less than 0.5 times the diameters of the associated trapping cavities 97. For exemplary trapping cavities 97 with diameters of about 1.0 μm, exemplary entrance ports 104 have diameters of about 0.33 μm or less. The previously formed alignment marks enable optical alignment of a contact mask (not shown) used to lithographically fabricate photoresist mask 103, which controls the dry etch. The dry etch stops on the underlying $SiO_2$ layer 96 and on the sacrificial amorphous silicon thereby completing the Al top end cap electrodes. Since the initial Al layer 102 of structure 75 had a flat lower surface, the final Al top end cap electrodes have flat lower surfaces. Suitable dry etches for Al have already been described with respect to above step 51. The second step of the series involves performing a dry etch to remove exposed portions of the $SiO_2$ layer 96. This second dry etch stops on underlying Al layer 95 and on the sacrificial amorphous silicon. The second dry etch exposes the top surface of electrical contact 98. Suitable dry etches for $SiO_2$ were already described with respect to step 51. After the two dry etches a conventional strip removes the photoresist mask.

Finally, a plasma enhanced CVD forms a Si layer 106 having a thickness of about 0.2 μm over the top surface of thin layer structure to (step 58). The Si layer 106 physically protects the thin layer structure 21 during handling associated with performing the sequence of steps from the backside of the wafer 23. Alternate embodiments may form the protective layer 106 of photoresist rather than Si.

The sequence of steps from the front surface of Si wafer 23 completes fabrication of the trap's electrodes. The fabricated end cap electrodes and associated central electrodes form circularly cylindrical cavities 97 for the ion traps. The trapping cavities 97 have heights, h, that are smaller than the thickness of the layer structure 21. In some embodiments, the trapping cavities 97 have right circularly cylindrical shapes and are constructed to have height to diameter ratios in the range of about 0.83 and 1.00 and preferably of about 0.897 so that octapole contributions to electric field distributions are small during operation of the ion traps.

From the backside of the wafer 23, the method 50 includes performing the following steps.

First, a conventional mechanical grinding step reduces the thickness of the wafer 35 in structure 77 from about 750 μm to about 300 μm to reduce the time needed for the backside etch (step 59). After the grinding step, the wafer 23 is preferably as thin as possible for safe and convenient handling.

Figure 12:
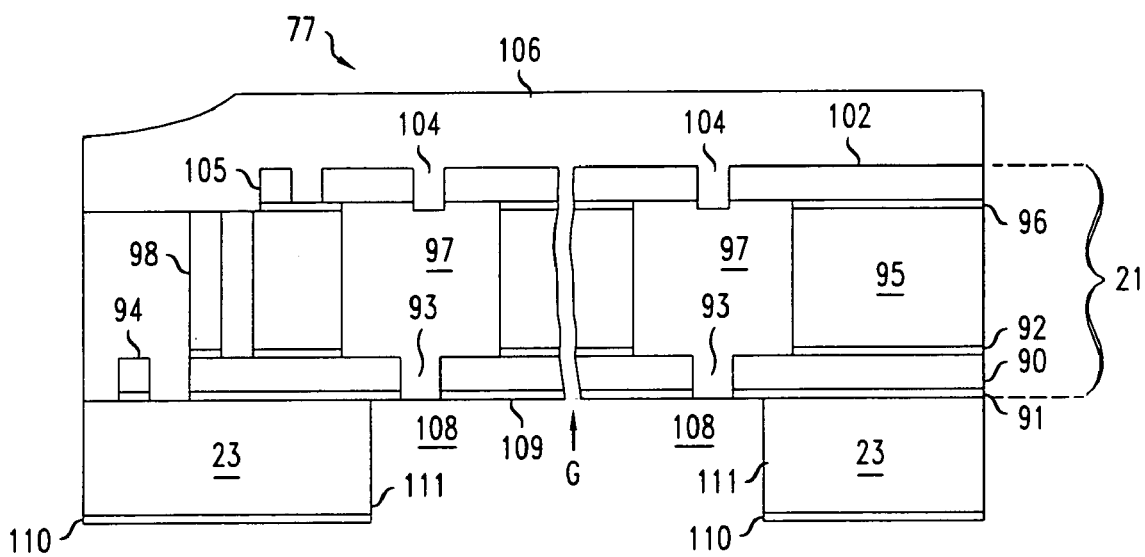

Next, a deep etch forms backside deep vias 108 that expose the Al bottom end cap electrodes as show in structure 77 of FIG. 12 (step 60). The deep etch removes both portions of Si wafer 23 and any portions of $SiO_2$ layer 91 that remain at the bottom of the deep vias 108. The front side alignment marks provide optical references for aligning a contact mask used to lithographically fabricate a photoresist mask 110 that controls the deep etch.

Performing the deep etch involves forming photoresist mask 110 on the backside of the wafer 23 and then, performing a series of alternating shallow plasma etches, i.e., etches to depths of 2 μm to 3 μm, and polymer depositions. The series of plasma etches substeps and polymer deposition substeps produces deep via 108 with substantially vertical sidewalls 111. Exemplary conditions for the plasma etch substeps are a reactive gas mixture of $SF_6$ and Ar, a gas flow of less than 100 sccm, a pressure of $10^{-5}$– $10^{-4}$ bar, and a microwave energy of 300–1200 watts at 2.45 GHz for generating the plasma. The polymer deposition substeps produce substantially uniform coatings of fluorocarbons on the partially etched via, e.g., a layer of $CHF_3$. Each coating reduces lateral etching during the subsequent plasma etch substep. Exemplary conditions for the polymer deposition substeps include a gas mixture of $CHF_3$ and include using Ar and flow, pressure, and microwave irradiation conditions similar to those of the etch substeps. Methods for performing such deep etches in Si wafers are described in the above incorporated '893 patent.

Next, a chemical etch of structure 77 removes the sacrificial material from both exit ports 93 and trapping cavities 97 (step 61). Exemplary conditions chemical etch involve performing about 50 to 100 repetitions of the following treatment: exposing the front side of structure 77 to $XeF_2$ gas for about 10 seconds at a pressure of about 2.9 Torr and then pumping out the resulting gases.

Above steps 59–61 clear trapping cavities 97 and exit ports 93 of sacrificial material and remove protective Si layer 106.

Figure 13:
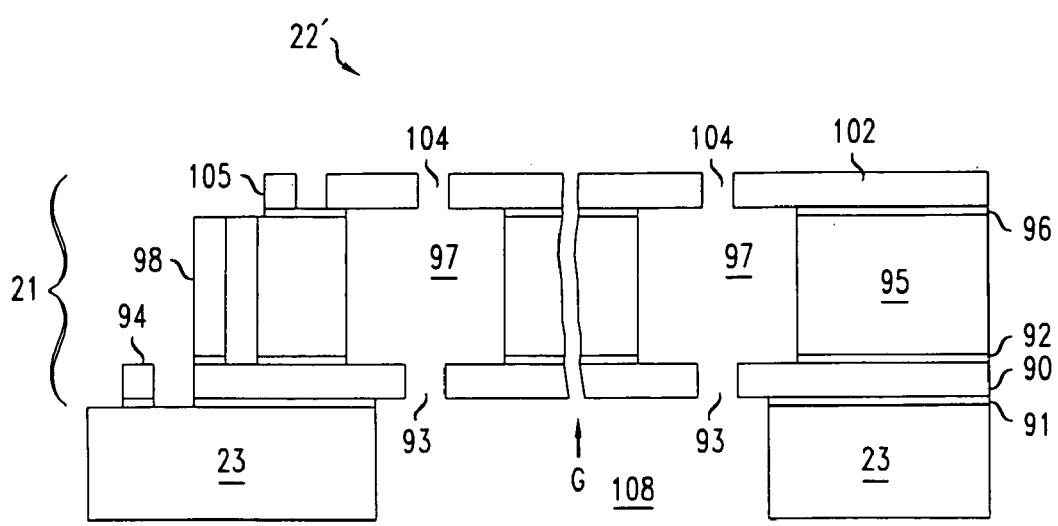
FIG. 13 is a cross-sectional view of a monolithic structure in which an array of quadrupole ion traps is fabricated on a silicon wafer.

In some embodiments, the chemical etch may be proceed from the back side or from both sides of the structure 77 thereby also clearing entrance ports 104 of protective Si layer 106. In embodiments where a back side chemical etch clears trapping cavities 97 and exit ports 93, another front side etch is performed to remove protective Si layer 106 thereby clearing the entrance ports 104 of material and producing final monolithic structure 22' for an array of ion traps as shown in FIG. 13.

In various embodiments of structure 22', individual ion traps have electrical contacts that enable either parallel trap operation or independent trap operation. In the embodiments with independently operable ion traps, the sequence of front side steps also produces lateral isolation barriers between the sets of electrodes for different ion traps. The barriers may, e.g., be trenches through Al layers 102, 95, 90 that encircle individual ion traps. The etches that form the traps' electrodes from the Al layers 102, 95, 90 will produce such trenches if the associated photoresist masks have appropriate features.

During performance of method 50, preferably Si wafer 23 and structures 71–77, 22' are maintained at temperatures below about 200° C. unless otherwise specified. These low processing temperatures tend to reduce bending stresses that are caused by the lattice mismatch between thin layer structure 21 and the underlying Si substrate 23. Such stresses could cause a measurable bowing of the Si wafer 23 if processing steps 51–61 proceeded at higher temperatures.

EXAMPLE 2

Another exemplary method for fabricating monolithic structure 22' of FIG. 13 involves modifying method 50 of FIG. 5 by substitutions of different materials. The substitutions involve using doped polysilicon for conductive layers 90, 95, 102 and using either $SiO_2$ or a spin on curable polymer for the sacrificial material of step 54. For such substitutions, the sequence of front side steps entails the following changes. The depositions for the conductive material of layers 90, 95, 102 involve performing plasma enhanced CVD depositions for polysilicon doped n-type or p-type with concentrations of $10^{19}$ or more dopant atoms per $cm^3$. The dry etches that form features in the conductive material of the doped polysilicon layers 90, 95, 102 involve performing conventional RIE plasma etches that are adapted to selectively remove polysilicon. The CMP for planarizing the top surface 101 of intermediate structure 74 of FIG. 9 uses a chemical polishing agent that selectively removes the $SiO_2$ or the cured polymer of the sacrificial material. The backside chemical etch for removing the sacrificial material uses a chemical agent and conditions adapted to removing $SiO_2$ or a spin on curable polymer as appropriate, e.g., a wet etch in HF is appropriate for $SiO_2$ sacrificial material.

In other embodiments, the thin layer structure 21 and trapping cavities have other sizes, but height to diameter ratios of said cavities preferably are in the above-described ranges to reduce the size of octapole contributions to trapping electric fields.

Other embodiments of the invention will be apparent to those of skill in the are in light of the specification, drawings, and claims of this application.

What is claimed is:

1. An apparatus, comprising:
   a semiconductor or dielectric wafer having front and back surfaces;
   a sequence of alternating conductive and dielectric layers formed over said front surface, the sequence including top and middle conductive layers, the middle conductive layer being closer to said wafer than the top conductive layer; and
   a bottom conductive layer; and
   wherein the middle conductive layer has a substantially right cylindrical cavity that crosses a width of the middle conductive layer, the top and bottom conductive layers cap respective first and second ends of the cavity; and
   wherein the top conductive layer includes a hole that forms a first access port to the cavity; and
   wherein the wafer includes a via through the width of the wafer, the via provides access to the cavity via the back surface of the wafer, and the wafer is substantially thicker than the sequence of layers.

2. The apparatus of claim 1, wherein the wafer is ten or more times as thick as the sequence of layers.

3. The apparatus of claim 1, wherein the sequence comprises the bottom conductive layer that caps the second end of the cavity.

4. The apparatus of claim 1, wherein the wafer comprises a conductive region that forms the bottom conductive layer that caps the second end of the cavity.

5. The apparatus of claim 1, wherein the cavity has a height that is less than about 10 microns.

6. The apparatus of claim 2, wherein the conductive layers and conductive material comprise metal, heavily doped semiconductor, or silicide.

7. The apparatus of claim 2, wherein one dielectric layer of the sequence electrically insulates the middle conductive layer from the top conductive layer and another dielectric layer of the sequence electrically insulates the middle conductive layer from the bottom conductive layer.

8. The apparatus of claim 1, wherein the cavity has a circular cross section.

9. The apparatus of claim 1, further comprising an ion detector located to detect ions ejected from the via.

10. The apparatus of claim 9, further comprising an electron gun located to ionize molecules traveling towards the first access port.

11. The apparatus of claim 1,
    wherein the middle conductive layer includes a second cylindrical cavity that crosses the width thereof, the top conductive layer capping a first end of the second cavity, and the bottom conductive layer capping a second end of the second cavity; and
    wherein a second hole through the top conductive layer forms a first access port to the second cavity; and
    wherein a via through the width of the wafer and provides access to the second cavity via the back surface of the wafer.

12. A method for fabricating an ion trap, comprising:
    forming a sequence of alternating conductive and dielectric layers on a planar front surface of a dielectric or semiconductor wafer;
    etching a right cylindrical cavity through one conductive layer of the sequence to produce a central electrode of the ion trap;
    forming another conductive layer over said central electrode;
    etching a hole through said another conductive layer to produce a first end cap electrode of the cavity, the hole forming an access port to said cavity;
    etching through a back surface of said wafer to produce a via that provides an access to a second end cap electrode for said cavity, the second end cap electrode including one of another conductive layer of the sequence and a conductive region of the wafer.

13. The method of claim 12, further comprising:
    depositing a sacrificial material to fill said cavity and producing a flat top surface over an end of the cavity prior to performing the forming another conductive layer; and
    etching said sacrificial material from said cavity after performing the forming another conductive layer.

14. The method of claim 12, further comprising:
    etching the one of another conductive layer of the sequence and a conductive region of the wafer to form a second access port to the cavity.

15. The method of claim 12, wherein the wafer has a thickness that is ten or more times as larger as the height of the cavity.

16. The method of claim 12, wherein the cavity has a height of 100 micrometers or less.

17. The method of claim 12, wherein the second end cap electrode is another conductive layer of the sequence.

18. The method of claim 12, wherein the conductive layers are metallic, heavily doped semiconductor, or silicide.

19. The method of claim 17, wherein forming a sequence further comprises:
   forming the another conducting layer of the sequence over a surface of the wafer;
   forming one dielectric layer on the another conducting layer of the sequence; and
   then, forming said one conductive layer of the sequence on said one dielectric layer.

20. The method of claim 12, wherein the cavity has one of a circular cross section and an oval cross section.

* * * * *